(12) United States Patent
Akkinepally et al.

(10) Patent No.: US 11,233,009 B2
(45) Date of Patent: Jan. 25, 2022

(54) EMBEDDED MULTI-DIE INTERCONNECT BRIDGE HAVING A MOLDED REGION WITH THROUGH-MOLD VIAS

(71) Applicant: Intel Corporation, Santa Clara, CA (US)

(72) Inventors: Praneeth Kumar Akkinepally, Tempe, AZ (US); Frank Truong, Gilbert, AZ (US); Jason M. Gamba, Gilbert, AZ (US); Robert Alan May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 16/832,150

(22) Filed: Mar. 27, 2020

(65) Prior Publication Data
US 2021/0305163 A1 Sep. 30, 2021

(51) Int. Cl.
*H01L 23/538* (2006.01)
*H01L 25/065* (2006.01)
*H01L 23/31* (2006.01)

(52) U.S. Cl.
CPC ...... *H01L 23/5381* (2013.01); *H01L 23/3157* (2013.01); *H01L 23/5384* (2013.01); *H01L 23/5386* (2013.01); *H01L 25/0655* (2013.01)

(58) Field of Classification Search
CPC ............. H01L 23/5381; H01L 23/5384; H01L 23/3157; H01L 23/5386; H01L 25/0655
See application file for complete search history.

(56) References Cited

U.S. PATENT DOCUMENTS

| | | | |
|---|---|---|---|
| 8,901,748 B2 | 12/2014 | Manusharow et al. | |
| 9,275,955 B2 | 3/2016 | Mahajan et al. | |
| 2016/0071818 A1* | 3/2016 | Wang | H01L 24/06 257/774 |
| 2017/0040264 A1 | 2/2017 | Qian et al. | |
| 2018/0175001 A1* | 6/2018 | Pyo | H01L 23/5383 |
| 2018/0240778 A1 | 8/2018 | Liu et al. | |
| 2020/0411443 A1* | 12/2020 | Guo | H01L 23/5386 |

* cited by examiner

*Primary Examiner* — Quoc D Hoang
(74) *Attorney, Agent, or Firm* — Patent Capital Group

(57) ABSTRACT

Microelectronic assemblies, related devices and methods, are disclosed herein. In some embodiments, a microelectronic assembly may include a package substrate having a first surface and an opposing second surface; a microelectronic component embedded in the package substrate, the microelectronic component including: a substrate having a surface, where the substrate includes a conductive pathway and a mold material region at the surface, where the mold material region includes a through-mold via (TMV) electrically coupled to the conductive pathway, and where the mold material region is at the second surface of the package substrate; and a die conductively coupled, at the second surface of the package substrate, to the package substrate and to the TMV of the microelectronic component.

15 Claims, 11 Drawing Sheets

EMBEDDED MULTI-DIE INTERCONNECT BRIDGE HAVING A MOLDED REGION WITH THROUGH-MOLD VIAS

BACKGROUND

Integrated circuit (IC) packages may include an embedded multi-die interconnect bridge (EMIB) for electrically coupling two or more IC dies. With conventional manufacturing processes, IC packages including an EMIB are not scalable to a finer bump pitch due to an increase in via taper. Typically, EMIBs are susceptible to damage during embedding in IC packages and to warpage during operation of the IC package, which may result in non-functioning IC packages.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
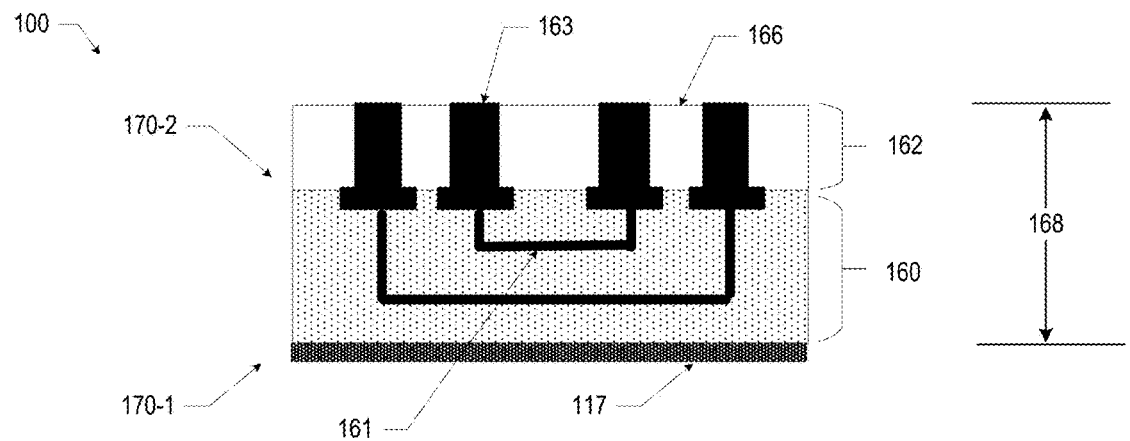
FIG. 1 is a side, cross-sectional view of an example microelectronic component, in accordance with various embodiments.

Microelectronic components, and related assemblies, devices and methods, are disclosed herein. For example, in some embodiments, a microelectronic component may include a substrate having a surface, where the substrate includes a conductive pathway and a mold material region at the surface, where the mold material region includes a through-mold via (TMV) electrically coupled to the conductive pathway. In some embodiments, a microelectronic assembly may include a package substrate having a first surface and an opposing second surface; a microelectronic component embedded in the package substrate, the microelectronic component including: a substrate having a surface, wherein the substrate includes a conductive pathway and a mold material region at the surface, wherein the mold material region includes a TMV electrically coupled to the conductive pathway, and wherein the mold material region is at the second surface of the package substrate; and a die conductively coupled, at the second surface of the package substrate, to the package substrate and to the TMV of the microelectronic component.

The drive for miniaturization of IC devices has created a similar drive to provide dense interconnections between dies in a package assembly. For example, microelectronic components, such as interposers and bridges, are emerging to provide dense interconnect routing between dies or other electrical components. To increase the functionality of a package substrate, an interposer or a bridge may be embedded in the package substrate to route signals between one or more dies as in EMIB architectures. Scalable high aspect ratio components, that provide even more dense interconnections, using conventional manufacturing equipment may be desired. The processes disclosed herein may be used to apply existing semiconductor processing techniques to fabricate high aspect ratio components and integrate them into an IC package. This improvement in computing density may enable new form factors for wearable computing devices and system-in-package applications in which dimensions are constrained as well as in applications where dimensions may not be constrained, such as for server products and architectures. Various ones of the embodiments disclosed herein may improve IC package performance with greater design flexibility, at a lower cost, and/or with a reduced size relative to conventional approaches while improving the ease of manufacturing relative to conventional approaches. Limitations of the IC manufacturing processes prevent dies having fine interconnect pitch from being directly mounted to a package substrate. Various embodiments of the microelectronic assemblies disclosed herein may be capable of supporting dies with high density interconnects and dies with low-density interconnects without sacrificing performance or manufacturability. The microelectronic assemblies disclosed herein may be advantageous for small and low-profile applications in computers, tablets, industrial robots, and consumer electronics (e.g., wearable devices) as well as for larger scale applications in server products and architectures.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

When used to describe a range of dimensions, the phrase "between X and Y" represents a range that includes X and Y. For convenience, the phrase "FIG. 3" may be used to refer to the collection of drawings of FIGS. 3A-3E, the phrase "FIG. 4" may be used to refer to the collection of drawings of FIGS. 4A-4H, etc. Although certain elements may be referred to in the singular herein, such elements may include multiple sub-elements. For example, "an insulating material" may include one or more insulating materials. As used herein, "a conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. As used herein, the term "TSV" is defined as "through-substrate via" and is distinguished from the common term "through-silicon via" in that the substrate may include a silicon material but is not required to include a silicon material, as described below with reference to FIG. 1.

Figure 2:
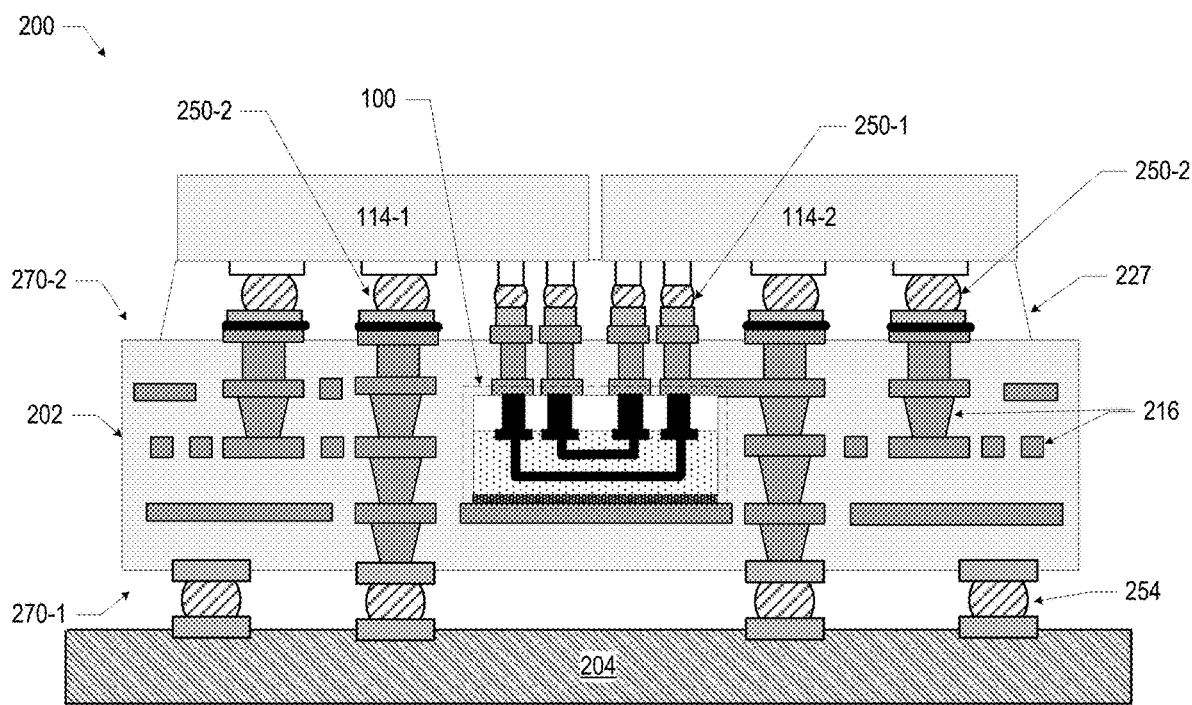
FIG. 2 is a side, cross-sectional view of an example microelectronic assembly including the microelectronic component of FIG. 1, in accordance with various embodiments.

FIG. 1 is a side, cross-sectional view of a microelectronic component 100, in accordance with various embodiments. The microelectronic component 100 may include a substrate 160 having a first surface 170-1 and an opposing second surface 170-2, where the substrate includes a conductive pathway 161, and a mold material layer 162 at the second surface 170-2 of the substrate 160, where the mold material layer 162 includes a mold material 166 and a plurality of TMVs 163 (also referred to herein as conductive pillars) conductively coupled to the conductive pathway 161 in the substrate 160. In some embodiments, an individual TMV 163 may be conductively coupled to an individual conductive pathway 161. In some embodiments, an individual TMV 163 may be conductively coupled to two or more conductive pathways 161. As used herein, the terms "electrically coupled" and "conductively coupled" may be used interchangeably. As used herein, "mold material layer," "mold material region," "mold layer," and "mold region" may be used interchangeably. In some embodiments, the microelectronic component 100 may further include a bonding layer 117, such as an adhesive layer or a die attach film (DAF), for attaching the microelectronic component 100 to a package substrate, as depicted in FIG. 2 and as described in FIG. 4. The microelectronic component 100 also may be referred to herein as "an EMIB," "an interconnect," or "a bridge."

The substrate 160 may be formed of any suitable insulating material (e.g., a dielectric material formed in multiple layers, as known in the art). The insulating material of the substrate 160 may include a dielectric material, such as silicon dioxide, silicon nitride, oxynitride, polyimide materials, glass reinforced epoxy matrix materials, or a low-k or ultra-low-k dielectric (e.g., a carbon-doped dielectric, a fluorine-doped dielectric, a porous dielectric, an organic polymeric dielectric, a photo-imageable dielectric, and/or a benzocyclobutene-based polymer). In some embodiments, the insulating material may include a semiconductor material, such as silicon, germanium, or a III-V material (e.g., gallium nitride), and one or more additional materials. For example, an insulating material may include silicon oxide or silicon nitride. The substrate 160 may have any suitable thickness. In some embodiments, the substrate 160 has a thickness (e.g., z-height) between 25 microns and 100 microns. The conductive pathways 161 may be formed of any appropriate conductive material, such as copper, silver, nickel, gold, aluminum, or other metals or alloys, for example. In some embodiments, the substrate 160 may be a die or a wafer, such as an active wafer or a passive wafer. In some embodiments, the substrate may include additional conductive components, such as signal traces, resistors, capacitors, or inductors. In some embodiments, the substrate 160 may further include TSVs. In some embodiments, the conductive pathways 161 in the substrate 160 may be TSVs, as described below with reference to FIG. 5.

The mold material 166 in the mold material layer 162 may be any suitable insulating material that provides mechanical support to the microelectronic component 100. The mold material 166 may reduce the likelihood of damage to the plurality of TMVs 163, which may increase functionality and manufacturing yields (i.e., decrease the number of rejects). In some embodiments, the mold material may be selected to provide a rigid structure having low warpage. In some embodiments, the mold material is an organic polymer. In some embodiments, the mold material is an organic polymer with a filler, such as inorganic silica particles or alumina. In some embodiments, the mold material is an organic dielectric material, a fire retardant grade 4 material (FR-4), a bismaleimide triazine (BT) resin, a polyimide material, a glass reinforced epoxy matrix material, or a low-k and ultra-low-k dielectric (e.g., carbon-doped dielectrics, fluorine-doped dielectrics, porous dielectrics, and organic polymeric dielectrics). In some embodiments, the mold material 166 is an epoxy mold compound, an epoxy-based dielectric, or a photo-imageable dielectric. The mold material 166 may have any suitable thickness. In some embodiments, the mold material 166 may have a same thickness as the plurality of TMVs 163. In some embodiments, the mold material 166 may have a thickness (e.g., z-height) between 5 microns and 50 microns.

The TMVs 163 may be formed of any appropriate conductive material, such as copper, silver, nickel, gold, aluminum, or other metals or alloys, for example. The TMVs 163 may be formed using any suitable process, including, for example, the process described with reference to FIG. 3. The TMVs 163 may have any suitable size and shape. In some embodiments, the TMVs 163 may have a circular, rectangular, or other shaped cross-section. In some embodiments, the TMVs 163 may have a thickness (e.g., z-height) between 5 microns and 50 microns and a cross-section between 5 microns and 50 microns. In some embodiments, the TMVs 163 may have a pitch between 15 microns and 70 microns. As used herein, pitch is measured center-to-center between adjacent TMVs (e.g., from a center of a TMV to a center of an adjacent TMV).

In some embodiments, the microelectronic component 100 may have an overall thickness 168 between 30 microns and 150 microns, and the mold material may be selected to provide the microelectronic component 100 a rigid structure having low warpage. The microelectronic component 100 of FIG. 1 may be formed using any suitable processing technique, including, for example, the process technique described below with reference to FIG. 3.

Although FIG. 1 shows a particular arrangement of a microelectronic component 100 having a particular number of conductive pathways 161 in the substrate 160, a particular number of TMVs 163, and a particular arrangement of the TMVs 163 electrically coupled to the conductive pathways 161, a microelectronic component 100 may include any number and arrangement of conductive pathways 161 and TMVs 163. Many of the elements of the microelectronic component 100 of FIG. 1 are included in other ones of the accompanying figures; the discussion of these elements is not repeated when discussing these figures, and any of these elements may take any of the forms disclosed herein.

FIG. 2 is a side, cross-sectional view of a microelectronic assembly 200 including a package substrate 202, a microelectronic component 100 embedded in the package substrate 202, and multiple dies 114 disposed thereon. The microelectronic component 100 may provide high density interconnect routing in a localized area of the microelectronic assembly 200. In some embodiments, the presence of the microelectronic component 100 may support direct attach of fine-pitch semiconductor dies (e.g., the dies 114-1 and 114-2) that cannot be attached directly to the package substrate 202. In particular, the microelectronic component 100 may support trace widths and spacings that are not achievable in the package substrate 202.

The package substrate 202 may include an insulating material (e.g., a dielectric material formed in multiple layers, as known in the art) and one or more conductive pathways through the dielectric material (e.g., including conductive traces and/or conductive vias, as shown). In some embodiments, the insulating material of the package substrate 202 may be a dielectric material, such as an organic dielectric material, a fire retardant grade 4 material (FR-4), a BT resin, a polyimide material, a glass reinforced epoxy matrix material, or a low-k and ultra-low-k dielectric (e.g., a carbon-doped dielectric, a fluorine-doped dielectric, a porous dielectric, and an organic polymeric dielectric). In some embodiments, the insulating material may be an organic material, such as an epoxy-based laminate or a build-up film (e.g., Ajinomoto build-up film). The insulating material may include, for example, an epoxy with a phenolic hardener. In particular, when the package substrate 202 is formed using standard printed circuit board (PCB) processes, the package substrate 202 may include FR-4, and the conductive pathways in the package substrate 202 may be formed by patterned sheets of copper separated by build-up layers of the FR-4.

The package substrate 202 may further include conductive pathways 216 through an insulating material. The conductive pathways 216 may couple the dies 114 to a circuit board 204 (e.g., via the FLIs 250 and SLIs 254). Any suitable arrangement of conductive pathways 216 through any suitable number of insulating layers forming the package substrate 202 may couple the dies 114 to each other (not shown) and/or to other components (not shown) and the dies 114 to the circuit board 204, as desired. The conductive pathways 216 in the package substrate 202 may be made of any suitable conductive material, for example, copper. The conductive pathways 216 in the package substrate 202 may be bordered by liner materials, such as adhesion liners and/or barrier liners, as suitable. Although FIG. 2 shows a single microelectronic component 100 with two dies 114, a package substrate 202 may include any suitable number and arrangement of microelectronic components 100 and dies 114.

In some embodiments, the package substrate 202 may be a lower density medium and the dies 114-1, 114-2 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted copper, and with coarse vertical interconnect features formed by a standard laser process).

In some embodiments, the package substrate 202 may be formed using a lithographically defined via packaging process. In some embodiments, the package substrate 202 may be manufactured using standard organic package manufacturing processes, and thus the package substrate 202 may take the form of an organic package. In some embodiments, the package substrate 202 may be a set of redistribution layers formed on a panel carrier by laminating or spinning on a dielectric material, and creating conductive vias and lines by laser drilling and plating. In some embodiments, the package substrate 202 may be formed on a removable carrier using any suitable technique, such as a redistribution layer technique. Any method known in the art for fabrication of the package substrate 202 may be used, and for the sake of brevity, such methods will not be discussed in further detail herein.

The die 114 disclosed herein may include an insulating material (e.g., a dielectric material formed in multiple layers, as known in the art) and multiple conductive pathways formed through the insulating material. In some embodiments, the insulating material of a die 114 may include a dielectric material, such as silicon dioxide, silicon nitride, oxynitride, a polyimide material, a glass reinforced epoxy matrix material, or a low-k or ultra-low-k dielectric (e.g., a carbon-doped dielectric, a fluorine-doped dielectric, a porous dielectric, an organic polymeric dielectric, a photo-imageable dielectric, and/or a benzocyclobutene-based polymer). In some embodiments, the insulating material of a die 114 may include a semiconductor material, such as silicon, germanium, or a III-V material (e.g., gallium nitride), and one or more additional materials. For example, an insulating material may include silicon oxide or silicon nitride. The conductive pathways (not shown) in a die 114 may include conductive traces and/or conductive vias, and may connect any of the conductive contacts in the die 114 in any suitable manner (e.g., connecting multiple conductive contacts on a same surface or on different surfaces of the die 114). The die 114 may be a mixed-pitch die (in the sense that the die 114 has sets of conductive contacts with different pitch), for example, the die 114 may have "coarser" conductive contacts for coupling to the package substrate 202 and "finer" conductive contacts for coupling to the TMVs 163 of the microelectronic component 100. The die 114 of the microelectronic subassembly 200 may be a single-sided die (in the sense that the die 114 only has conductive contacts on a single surface), or may be a double-sided die (in the sense that the die 114 has conductive contacts on a first surface and on an opposing second surface). Example structures that may be included in the dies 114 disclosed herein are discussed below with reference to FIG. 9. The conductive pathways in the dies 114 may be bordered by liner materials, such as adhesion liners and/or barrier liners, as suitable. In some embodiments, the die 114 is a wafer. In some embodiments, the die 114 is a monolithic silicon, a fan-out or fan-in package die, or a die stack (e.g., wafer stacked, die stacked, or multi-layer die stacked).

The dies 114-1, 114-2 may be coupled to the microelectronic component 100 and to the package substrate 210 via first level interconnects (FLIs) 250 (i.e., as depicted in FIG. 2, FLIs 250-1 and 250-2, respectively). The FLIs 250 disclosed herein may take any suitable form. In some embodiments, the FLIs 250 may include solder (e.g., solder bumps or balls that are subject to a thermal reflow to form the interconnects). In some embodiments, the FLIs 250 may include an anisotropic conductive material, such as an anisotropic conductive film or an anisotropic conductive paste. An anisotropic conductive material may include conductive materials dispersed in a non-conductive material. In some embodiments, the FLIs 250-1 (i.e., the FLIs between the dies 114 and the microelectronic component 100) have a pitch between 15 microns and 70 microns (e.g., between 20 microns and 50 microns). In some embodiments, the FLIs 250-2 (i.e., the FLIs between the dies 114 and the package substrate 202) have a pitch between 50 microns and 500 microns (e.g., between 80 microns and 120 microns).

Although two dies 114 are illustrated in FIG. 2, this is simply an example, and the microelectronic assembly 200 may include any suitable number of dies 114, including one or more dies 114. The dies 114 may perform any suitable functionality, and may include processing devices, memory, communications devices, sensors, or any other computing components or circuitry. For example, the die 114 may be a central processing unit (CPU), a graphics processing unit (GPU), an application-specific integrated circuit (ASIC), a programmable logic device (PLD), or any other desired processor or logic device. A memory die, for example, may be an erasable-programmable read-only memory (EPROM) chip, a non-volatile memory (e.g., 3D XPoint) chip, a volatile memory (e.g., high bandwidth memory) chip, or any other suitable memory device. In some embodiments, one of the dies 114-1 may be a PLD and the other die 114-2 may be a GPU. In some embodiments, the die 114-1 may be a CPU and the die 114-2 may be a memory die.

The microelectronic assembly 200 of FIG. 2 may also include an underfill material 227. In some embodiments, the underfill material 227 may be disposed between the dies 114 and the second surface 270-2 of the package substrate 202 around the associated FLIs 250. The underfill material 227 may be an insulating material, such as an appropriate epoxy material. In some embodiments, the underfill material 227 may include a capillary underfill, non-conductive film (NCF), or molded underfill. In some embodiments, the underfill material 227 may include an epoxy flux that assists with soldering the dies 114-1, 114-2 to the package substrate 202 when forming the FLIs 250, and then polymerizes and encapsulates the FLIs 250. The underfill material 227 may be selected to have a coefficient of thermal expansion (CTE) that may mitigate or minimize the stress between the dies 114-1, 114-2 and the package substrate 202 arising from uneven thermal expansion in the microelectronic subassembly 200. In some embodiments, the CTE of the underfill material 227 may have a value that is intermediate to the CTE of the package substrate 202 (e.g., the CTE of the dielectric material of the package substrate 202) and a CTE of the dies 114-1, 114-2. In some embodiments, an overmold material (not shown) may be disposed around the dies 114 and in contact with the second surface 270-2 of the package substrate 202. The overmold material may be an insulating material, such as an appropriate epoxy material.

The package substrate 202 may be coupled to the circuit board 204 via second level interconnects (SLIs) 254 at the first surface 270-1 of the package substrate 202. In some embodiments, the SLIs 254 may include solder balls (as illustrated in FIG. 2) for a ball grid array (BGA) coupling; in other embodiments, the SLIs 254 may include solder paste contacts to provide land grid array (LGA) interconnects, or any other suitable interconnect. The circuit board 204 may include conductive pathways (not shown) that allow power, ground, and other electrical signals to move between the circuit board 204 and the package substrate 202, as known in the art. Although FIG. 2 illustrates a single package substrate 202 disposed on the circuit board 204, this is simply for ease of illustration and multiple package substrates 202 having one or more dies 114 (i.e., IC packages) may be disposed on the circuit board 204. In some embodiments, the circuit board 204 may be a PCB (e.g., a motherboard). In some embodiments, the circuit board 204 may be another IC package, and the microelectronic assembly 200 may be a package-on-package structure. In some embodiments, the circuit board 204 may be an interposer, and the microelectronic assembly 200 may be a package-on-interposer structure.

A number of elements are illustrated in FIG. 2, but a number of these elements may not be present in microelectronic assemblies disclosed herein. Many of the elements of the microelectronic assembly 200 of FIG. 2 are included in other ones of the accompanying figures; the discussion of these elements is not repeated when discussing these figures, and any of these elements may take any of the forms disclosed herein. A number of elements are not illustrated in FIG. 2, but may be present in microelectronic subassemblies 200 disclosed herein; for example, a heat spreader, a highly thermally conductive material, additional active components, such as additional dies, or additional passive components, such as resistors, capacitors, and/or inductors, may be disposed on the second surface 270-2 or the first surface 270-1 of the package substrate 202, or embedded in the package substrate 202, and may be electrically connected by the conductive pathways 216 in the package substrate 202.

Figure 3A:
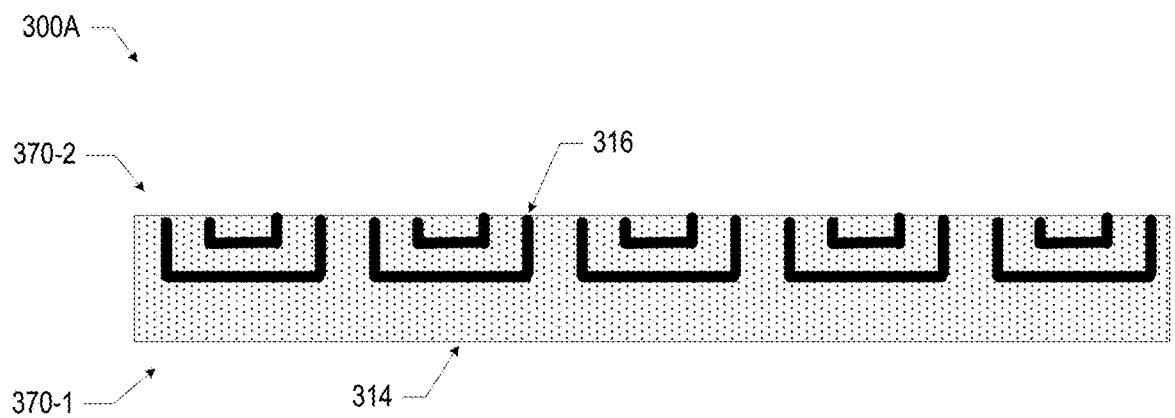
FIGS. 3A-3E are side, cross-sectional views of various stages in an example process for manufacturing the microelectronic component of FIG. 1, in accordance with various embodiments.

FIG. 3A illustrates an assembly 300A including a substrate 314 with a bottom surface 370-1 and a top surface 370-2, where the substrate 314 has a plurality of conductive pathways 316, where the conductive pathways 316 are exposed at the top surface 370-2. In some embodiments, the substrate 314 is an active wafer having an active layer (not shown) and a backside layer with conductive pathways 316, where non-electrical material is removed from the backside layer of the wafer (not shown) to expose the top surfaces 370-2 of the conductive pathways 316. In some embodiments, the substrate 314 is a passive wafer with conductive pathways 316, where non-electrical material is removed from the backside layer of the wafer to expose the top surfaces 370-2 of the conductive pathways 316. The non-electrical material, which is an inactive portion of the wafer, may include silicon, ceramic, or quartz, among other materials. The non-electrical material may be removed using any suitable technique, including, for example, grinding, etching, such as reactive ion etching (RIE) or chemical etching. In some embodiments, the substrate 314 is disposed on a carrier (not shown) during manufacturing operations. The carrier may include any suitable material for providing mechanical stability during manufacturing operations. When using a carrier, the substrate 314 may be attached to the carrier using any suitable technique, including a temporary adhesive layer or a DAF.

Figure 3B:
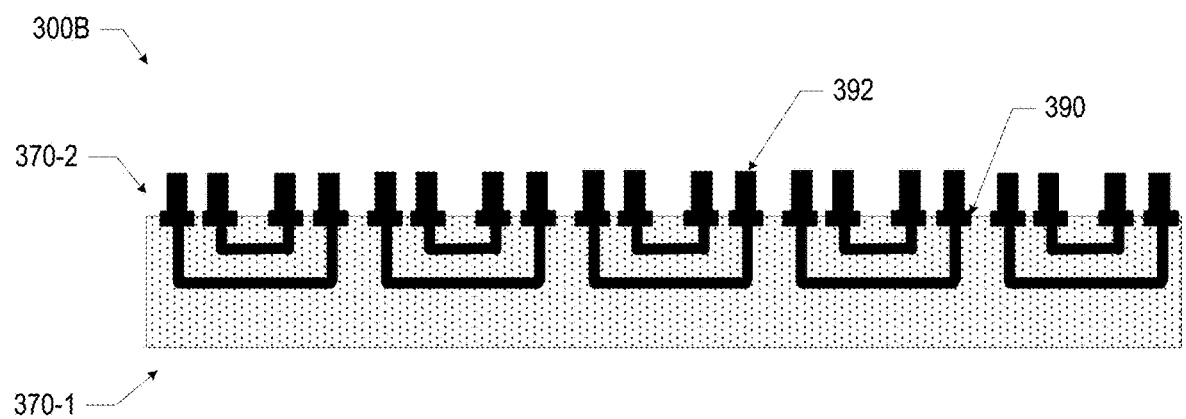

FIG. 3B illustrates an assembly 300B subsequent to forming conductive pillars 392 on the top surface 370-2 of the conductive pathways 316. The conductive pillars 392 may take the form of any of the embodiments disclosed herein (e.g., the TMVs 163 in FIG. 1), and may be formed using any suitable technique, for example, a lithographic process or an additive process, such as cold spray or 3-dimensional printing. For example, the conductive pillars 392 may be formed by depositing, exposing, and developing a photoresist layer on the top surface 370-2 of the substrate 314. The photoresist layer may be patterned to form cavities in the shape of the conductive pillars. Conductive material, such as copper, may be deposited in the openings in the patterned photoresist layer to form the conductive pillars 392. The conductive material may be depositing using any suitable process, such as electroplating, sputtering, or electroless plating. The photoresist may be removed to expose the conductive pillars 392. In another example, a photo-imageable dielectric may be used to form the conductive pillars 392. The conductive pillars 392 may have any suitable size and shape, as described above with reference to FIG. 1. In some embodiments, a conductive pad 390 may be formed on the top surface 370-2 of the conductive pathways prior to forming a conductive pillar 392. The conductive pads 390 may be formed using any suitable technique, such as any technique used to form the conductive pillars 392, and may made of any suitable conductive material, such as copper. In some embodiments, the conductive pads 390 may be omitted. In some embodiments, a seed layer (not shown) may be formed on the top surface 370-2 of the conductive pathways 316 prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted.

Figure 3C:
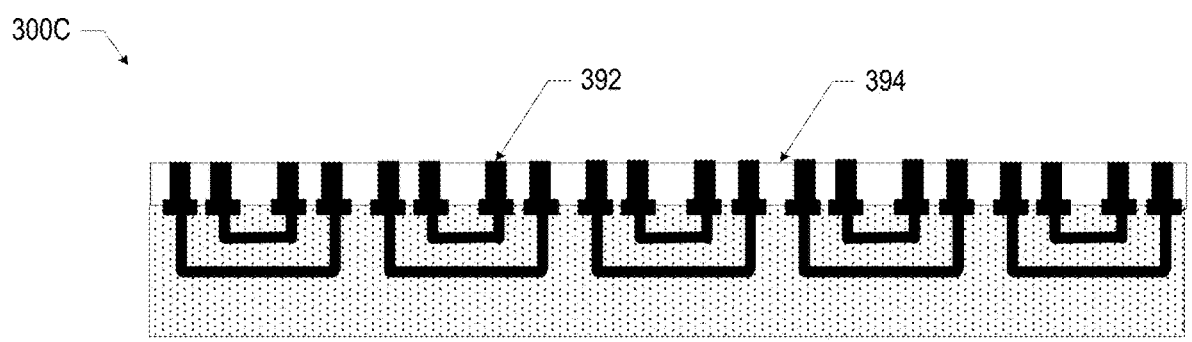

FIG. 3C illustrates an assembly 300C subsequent to providing a mold material 394 around the conductive pillars 392. The mold material 394 may be deposited using any suitable technique, such as compression molding, or lamination. In some embodiments, the mold material is cured subsequent to deposition. In some embodiments, the mold material 394 may be initially deposited on and over the tops of the conductive pillars 392, then, polished back and planarized to expose the top surfaces of the conductive pillars 392. The technique used to deposit the mold material may depend on the type of mold material used. The mold material may be removed using any suitable technique, including, for example, grinding, etching, such as RIE or chemical etching. In some embodiments, the mold material used may depend on the desired characteristics for a microelectronic component (e.g., microelectronic component 100). The mold material 394 may be any suitable mold material, as described above with reference to FIG. 1.

Figure 3D:
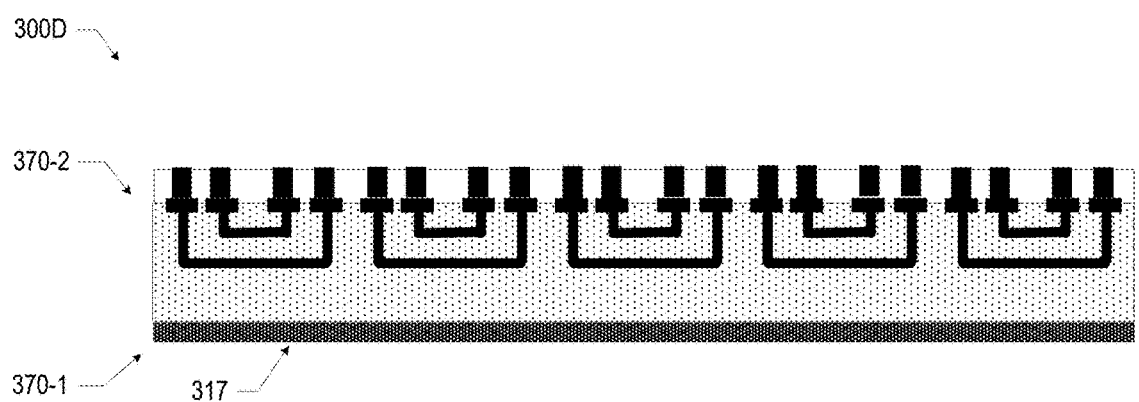

FIG. 3D illustrates an assembly 300D subsequent to attaching a bonding layer 317 on the bottom surface 370-1. The bonding layer 317 may be any suitable bonding layer, such as an adhesive layer or a DAF, and may be attached using any suitable technique, including a temporary adhesive or lamination. In some embodiments, the bonding layer 317 has a thickness between 5 microns and 30 microns.

Figure 3E:
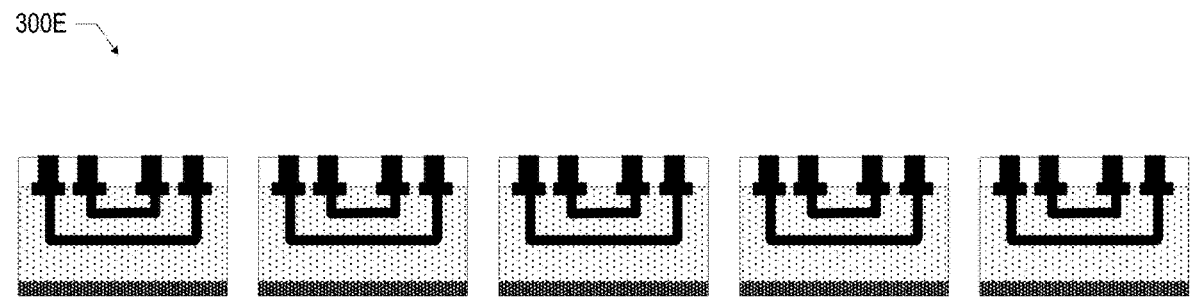

FIG. 3E illustrates an assembly 300E, also referred to herein as a microelectronic component, such as the microelectronic component 100, subsequent to singulating into individual units. In some embodiments, the individual units may be the same. In some embodiments, the individual units may differ.

Figure 4A:
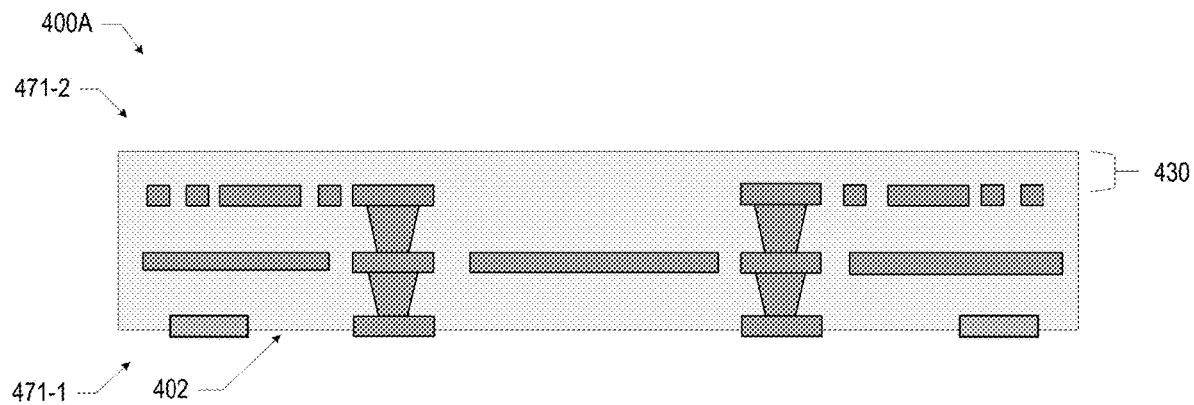
FIGS. 4A-4H are side, cross-sectional views of various stages in an example process for manufacturing the microelectronic assembly of FIG. 2, in accordance with various embodiments.

FIG. 4A illustrates an assembly 400A including a package substrate portion 402 having a bottom surface 471-1 and a top surface 471-2. The package substrate portion 402 may be structurally similar to the package substrate 202 of FIG. 2. The package substrate portion 402 may be built up to a desired dielectric layer 430 for integrating the microelectronic component 100. The package substrate portion 402 may be manufactured using any suitable manufacturing process. In some embodiments, the package substrate portion 402 may be formed using a semi-additive process. In some embodiments, the package substrate portion 402 may be manufactured using standard PCB manufacturing processes, and thus the package substrate portion 402 may take the form of a PCB, as discussed above. In some embodiments, the package substrate portion 402 may be a set of redistribution layers formed on a panel carrier (not shown) by laminating or spinning on a dielectric material, and creating conductive vias and lines by laser drilling and plating. Any method known in the art for fabrication of the package substrate portion 402 may be used, and for the sake of brevity, such methods will not be discussed in further detail herein.

Figure 4B:
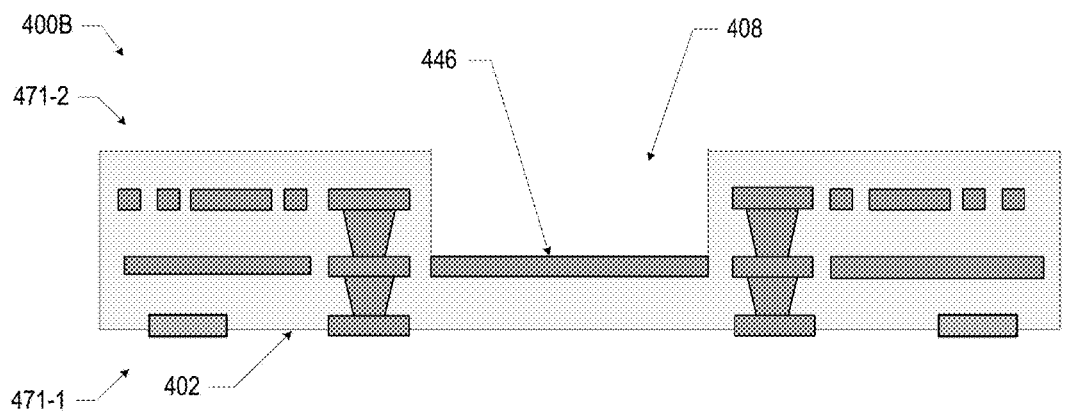

FIG. 4B illustrates an assembly 400B subsequent to forming a recess 408 in the package substrate portion 402 (e.g., assembly 400A of FIG. 4A). The recess 408 may have a bottom surface at which a planar metal stop 446 is exposed. Any suitable technique may be used to form the recess 408. For example, in some embodiments, the recess 408 may be laser-drilled down to a planar metal stop 446 in the package substrate portion 402. In some embodiments, the recess 408 may be formed by a mechanical drill. In some embodiments, any residue remaining in the opening may be cleaned away using any suitable process, such as a wet desmear process.

Figure 4C:
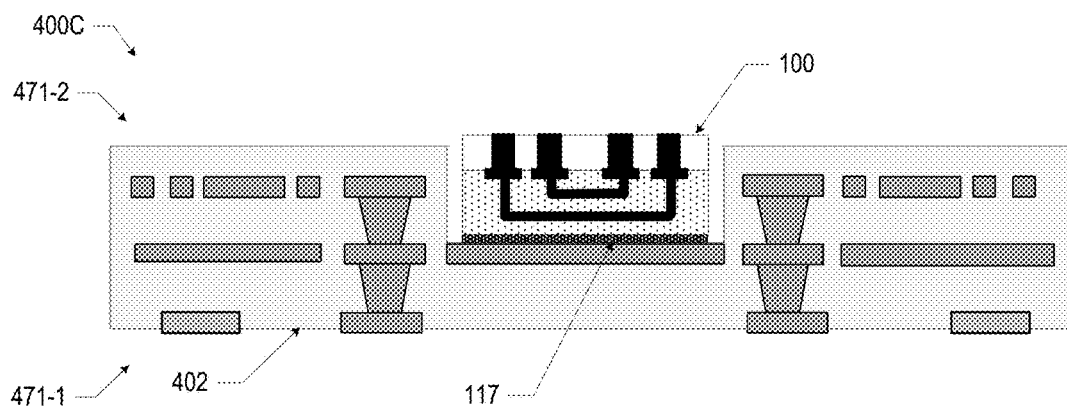

FIG. 4C illustrates an assembly 400C subsequent to aligning and placing a microelectronic component 100 in the recess 408 and attaching the microelectronic component 100 to the bottom of the recess 408 of the package substrate portion 402. The microelectronic component 100 may be attached using any suitable technique, for example, such as by a bonding layer 117.

Figure 4D:
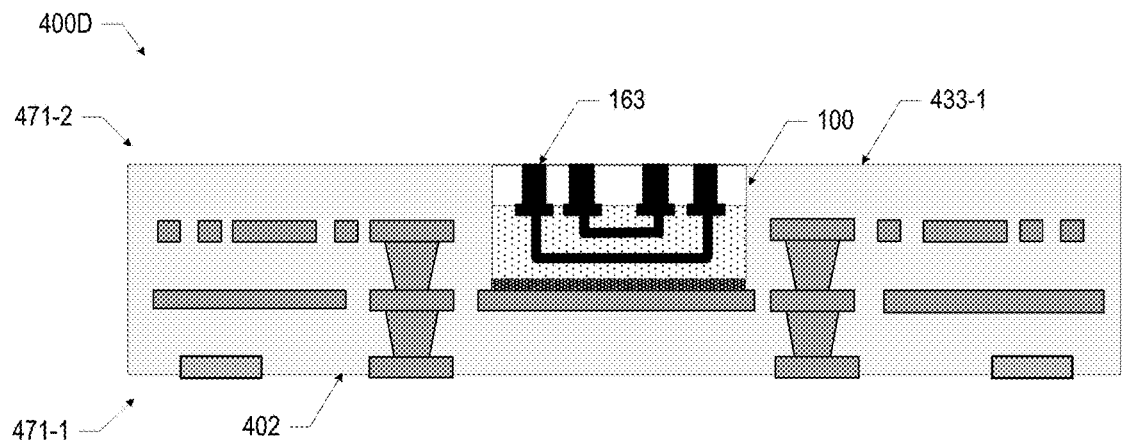

FIG. 4D illustrates an assembly 400D subsequent to providing an insulating material 433-1 on the top surface 471-2 of assembly 400C and around the microelectronic component 100. In some embodiments, the insulating material 433-1 may be a same material as the dielectric material of the package substrate portion 402, and may create a seam between the insulating material 433-1 surrounding the microelectronic component i.e., on the sides) and the adjacent dielectric material of the package substrate portion 402. In some embodiments, the insulating material 433-1 may be a different material than the dielectric material of the package substrate portion 402, and may create a seam identifying the insulating material 433-1 surrounding the microelectronic component (i.e., on the sides) from the adjacent dielectric material of the package substrate portion 402. In some embodiments, the insulating material 433-1 may be initially deposited on and over the top surface of microelectronic component 100, then polished back to expose the top surface 471-2 of the TMVs 163 in the microelectronic component 100. In some embodiments, the insulating material 433-1 is a dielectric material. In some embodiments, the dielectric material may include an organic dielectric material, a fire retardant grade 4 material (FR-4), a BT resin, a polyimide material, a glass reinforced epoxy matrix material, or a low-k and ultra-low-k dielectric (e.g., a carbon-doped dielectric, a fluorine-doped dielectric, a porous dielectric, and an organic polymeric dielectric). The dielectric material may be formed using any suitable process, including lamination, or slit coating and curing. If the dielectric layer is formed to completely cover the microelectronic component 100, the dielectric layer may be removed to expose the top surface of the TMVs 163 of the microelectronic component 100 using any suitable technique, including grinding, polishing, chemical and/or mechanical planarizing, or etching, such as a wet etch, a dry etch (e.g., a plasma etch), a wet blast, or a laser ablation (e.g., using excimer laser). In some embodiments, the thickness of the insulating material 433-1 may be minimized to reduce the etching time required.

Figure 4E:
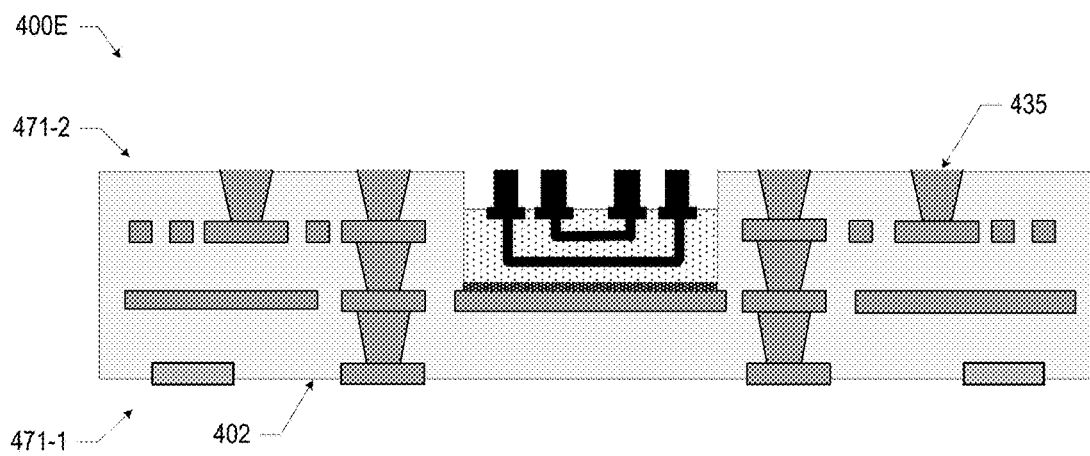

FIG. 4E illustrates an assembly 400E subsequent to forming via openings and depositing conductive material in the via openings to form vias 435 on assembly 400D. The via openings may be formed using any suitable technique, including, for example, laser drilling. Any residue remaining in the opening may be cleaned away using any suitable process, such as a wet desmear process. The conductive material may be deposited in the opening using any suitable technique, including, for example, electroplating, sputtering, or electroless plating. The conductive material may be any suitable conductive material, including, copper.

Figure 4F:
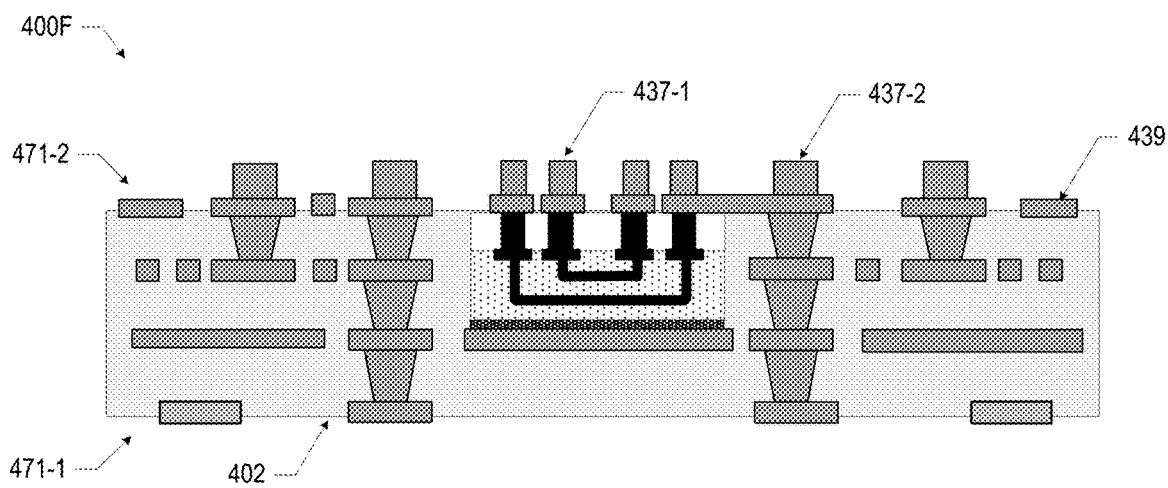

FIG. 4F illustrates an assembly 400F subsequent to forming metallization layer 439 and vias 437-1, 437-2 on the top surface 471-2 of assembly 400E. The metallization layer 439 and the vias 437-1, 437-2 may be formed using any suitable technique, including, for example, a lithographic process or an additive process, such as cold spray or 3-dimensional printing. For example, the metallization layer 439 and the vias 437-1, 437-2 may be formed by depositing, exposing, and developing multiple photoresist layers, and depositing a conductive material, such as a metal. The photoresist layers may be patterned to form openings in the shape of the metallization layer 439, and then, the vias 437-1, 437-2. Conductive material, such as copper, may be deposited in the openings in the patterned photoresist layers to form the metallization layer 439 and the vias 437-1, 437-2. The conductive material may be deposited in the openings using any suitable technique, including, for example, electroplating, sputtering, or electroless plating. The conductive material may be any suitable conductive material, including, copper. In some embodiments, a seed layer (not shown) may be formed on the top surface 471-2 of assembly 400E prior to depositing the photoresist material and the conductive material. The seed layer may be any suitable conductive material, including copper or titanium/copper. The seed layer may be removed, after removing the final photoresist layer, using any suitable process, including chemical etching, among others. In some embodiments, the seed layer may be omitted.

Figure 4G:
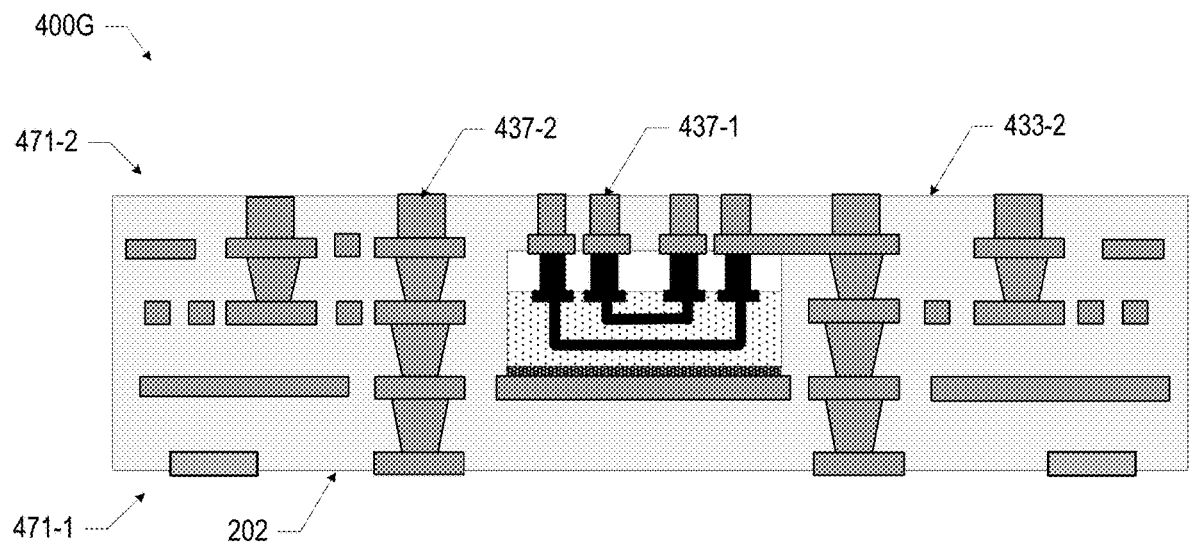

FIG. 4G illustrates an assembly 400G subsequent to providing an insulating material 433-2 on the top surface 471-2 of assembly 400F and around the vias 437 to form the finished package substrate 202. In some embodiments, the insulating material 433-2 may be initially deposited on and over the top surface of the vias 437, then removed to expose the top surface of the vias 437. In some embodiments, the insulating material 433-2 is a dielectric material. In some embodiments, the dielectric material may include an organic dielectric material, a fire retardant grade 4 material (FR-4), a BT resin, a polyimide material, a glass reinforced epoxy matrix material, or a low-k and ultra-low-k dielectric (e.g., a carbon-doped dielectric, a fluorine-doped dielectric, a porous dielectric, and an organic polymeric dielectric). The dielectric material may be formed using any suitable process, including lamination, or slit coating and curing. If the dielectric layer is formed to completely cover the vias 437, the dielectric layer may be removed to expose the top surface of the vias 437 using any suitable technique, including grinding or etching, such as a wet etch, a dry etch (e.g., a plasma etch), a wet blast, or a laser ablation (e.g., using excimer laser). In some embodiments, the thickness of the insulating material 433-2 may be minimized to reduce the etching time required.

Figure 4H:
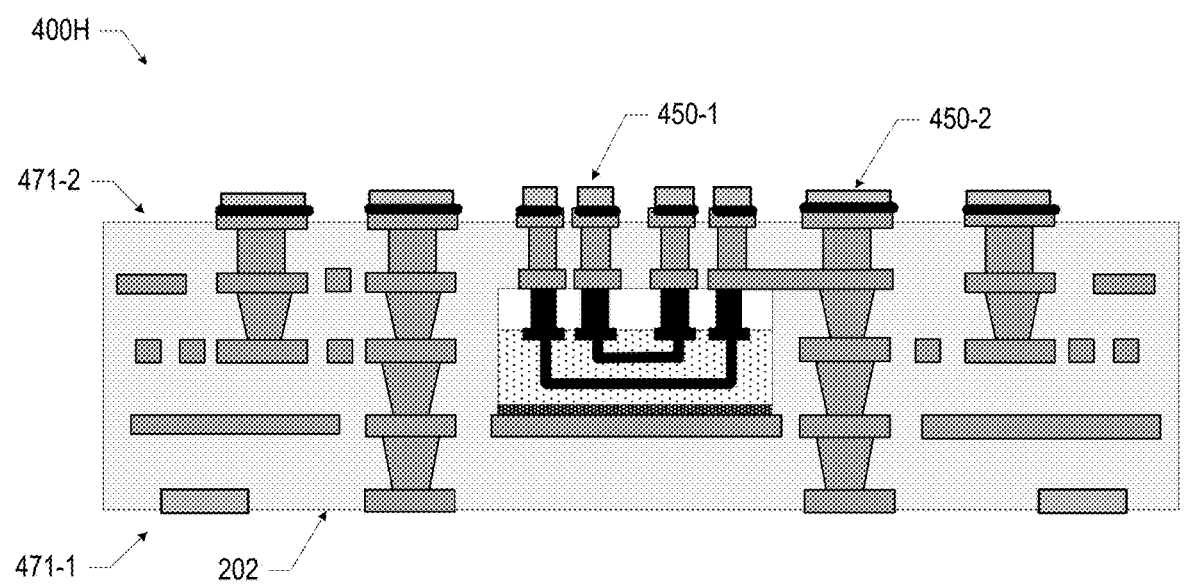

FIG. 4H illustrates an assembly 400H subsequent to forming conductive contacts 450-1, 450-2 on the top surface 471-2 of assembly 400G for coupling dies (not shown) to the microelectronic component 100 and to the finished package substrate 202, respectively, as depicted in FIG. 2. The conductive contacts 450 may be formed using any suitable technique, including, for example, a lithographic process or an additive process, and may be made of any suitable conductive material, such as copper. In some embodiments, the conductive contacts 450 may have multiple metal layers and each metal layer may include a different metal material. For example, the conductive contacts 450-1, 450-2 may include three metal layers—a first metal layer including copper, a second metal layer including nickel, and a third metal layer including tin. The tin layer may be planarized using any suitable chemical or mechanical etch, for example, chemical mechanical planarization or selective chemical etching. In some embodiments, the second metal layer may be an etch-stop layer. The finished package substrate 202 may be a single package substrate or may be a repeating unit that may undergo a singulation process in which each unit is separated for one another to create a single package substrate. Further operations may be performed as suitable (e.g., attaching dies to the package substrate, attaching solder balls for coupling to a circuit board, etc.).

Figure 5:
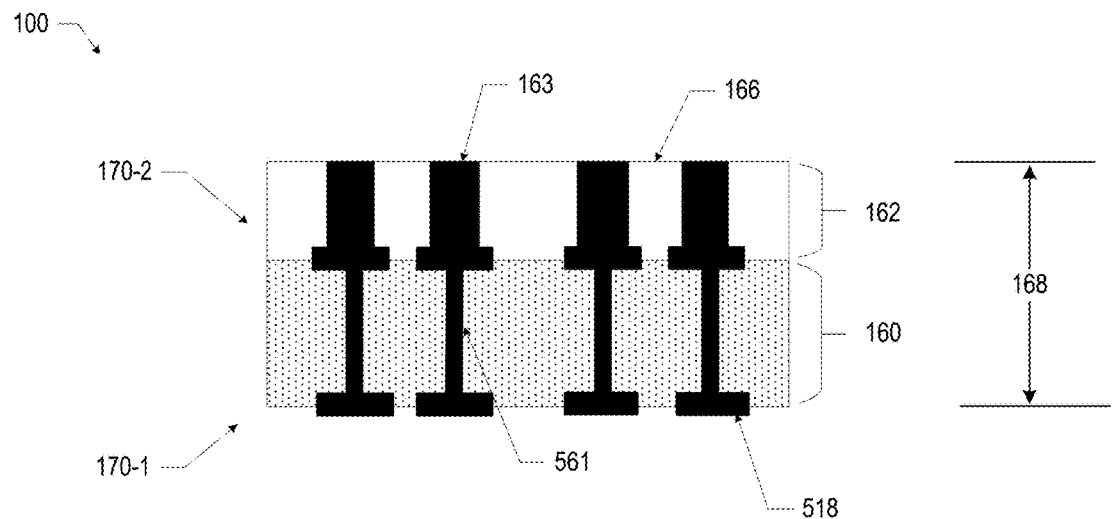
FIG. 5 is a side, cross-sectional view of another example microelectronic component, in accordance with various embodiments.
Figure 6:
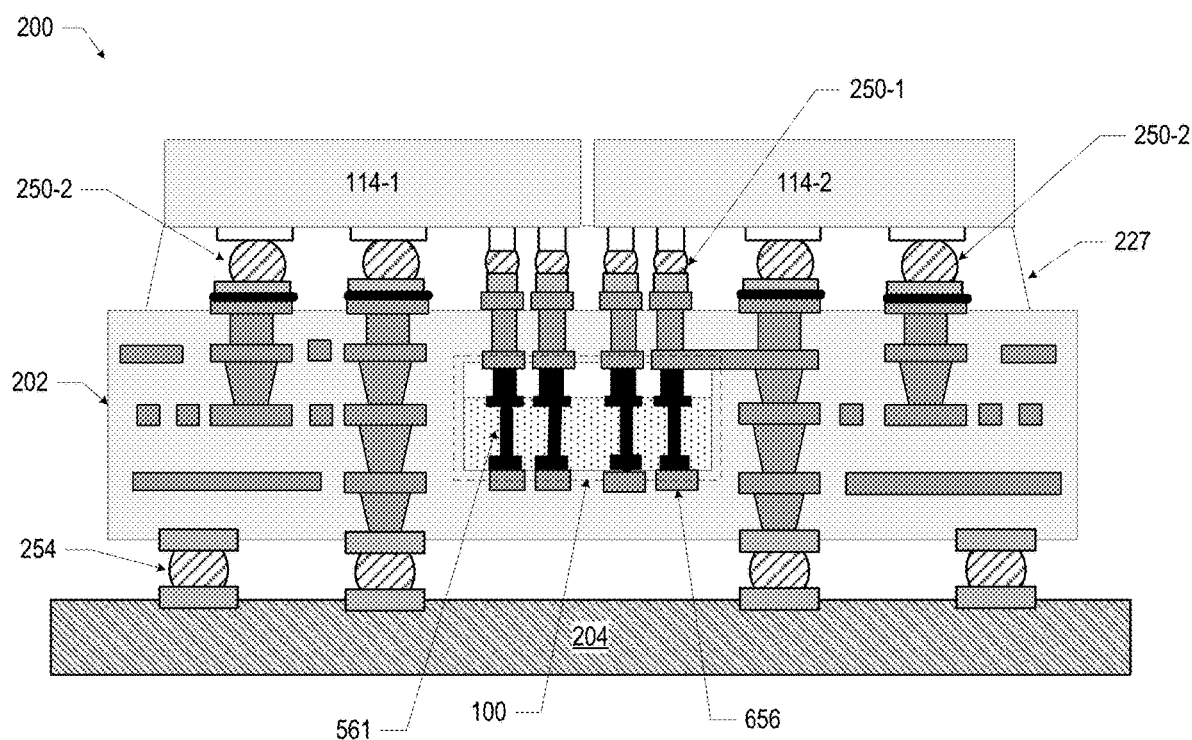
FIG. 6 is a side, cross-sectional view of another example microelectronic assembly, in accordance with various embodiments.

FIG. 5 is a side, cross-sectional view of another example of a microelectronic component 100, in accordance with various embodiments. The microelectronic component 100 may include a substrate 160 having a first surface 170-1 and an opposing second surface 170-2, where the substrate includes a plurality of TSVs 561, and a mold material layer 162 at the second surface 170-2, where the mold material layer 162 includes a mold material 166 and a plurality of TMVs 163 conductively coupled to the TSVs 561 in the substrate 160. In some embodiments, an individual TMV 163 may be conductively coupled to an individual TSV 561. In some embodiments, an individual TMV 163 may be conductively coupled to two or more TSVs 561. In some embodiments, the microelectronic component 100 may further include conductive contacts 518 on the first surface 170-1 of the substrate 160 for attaching the microelectronic component 100 to a package substrate, as depicted in FIG. 6. The microelectronic component 100 of FIG. 5 may be formed using any suitable processing technique, including, for example, the process technique described below with reference to FIG. 7.

FIG. 6 is a side, cross-sectional view of a microelectronic assembly 200 including a package substrate 202, the microelectronic component 100 of FIG. 5 embedded in the package substrate 202, and multiple dies 114 disposed thereon. The microelectronic component 100 may include the TSVs 561 coupled to conductive contacts 656 in the package substrate 202 via conductive contacts 518 to provide high density interconnect routing in a localized area of the microelectronic assembly 200 between the dies 114-1, 114-2.

Figure 7A:
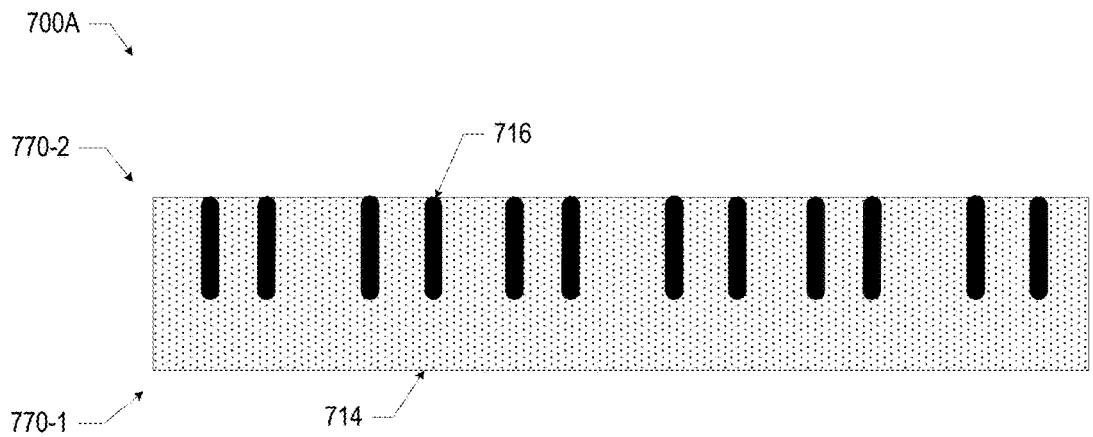
FIGS. 7A-7E are side, cross-sectional views of various stages in an example process for manufacturing the microelectronic component of FIG. 5, in accordance with various embodiments.

FIG. 7A illustrates an assembly 700A including a substrate 714 with a bottom surface 770-1 and a top surface 770-2 where the substrate 714 has a plurality of TSVs 716, where the TSVs 716 are exposed at the top surface 770-2. In some embodiments, the substrate 714 is an active wafer or passive wafer having TSVs 716, where non-electrical material is removed from the backside layer of the wafer to expose the top surfaces 770-2 of the plurality of TSVs 716. The non-electrical material, which is an inactive portion of the wafer, may include silicon, ceramic, or quartz, among other materials. The non-electrical material may be removed using any suitable technique, including, for example, grinding, etching, such as RIE or chemical etching. In some embodiments, the substrate 714 at the bottom surface 770-1 is disposed on a carrier (not shown) during manufacturing operations. The carrier may include any suitable material for providing mechanical stability during manufacturing operations. When using a carrier, the substrate 714 may be attached to the carrier using any suitable technique, including a temporary adhesive layer or a DAF.

Figure 7B:
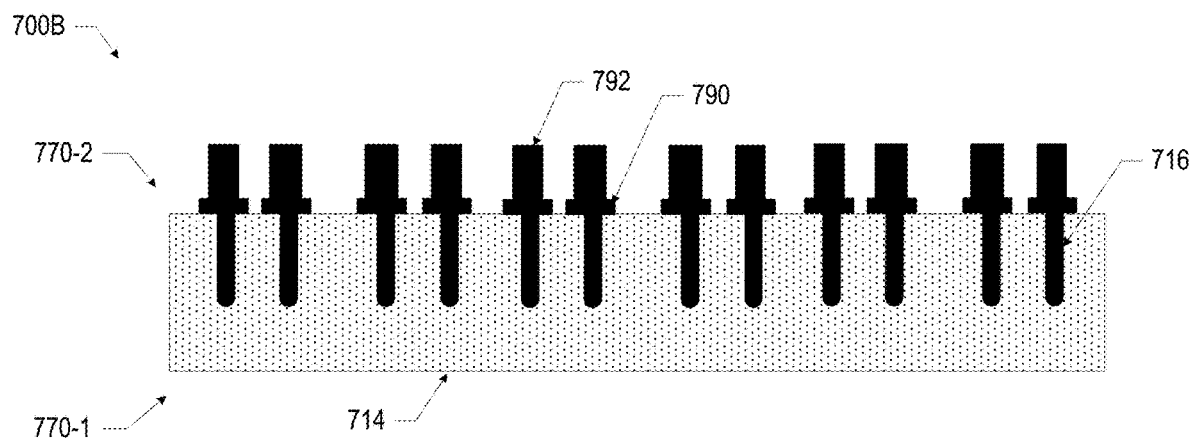

FIG. 7B illustrates an assembly 700B subsequent to forming conductive pillars 792 on the top surface 770-2 of the TSVs 716. The conductive pillars 792 may take the form of any of the embodiments disclosed herein (i.e., the TMVs 163 of FIG. 1 and FIG. 5), and may be formed using any suitable technique, for example, as described above with reference to FIG. 3. The conductive pillars 792 may have any suitable size and shape, as described above with reference to FIG. 1. In some embodiments, a conductive pad 790 may be formed on the top surface 770-2 of the TSVs 716 prior to forming a conductive pillar 792. The conductive pads 790 may be formed using any suitable technique, such as any technique used to form the conductive pillars 792, and may made of any suitable conductive material, such as copper, as described above with reference to FIG. 3. In some embodiments, the conductive pads 790 may be omitted.

Figure 7C:
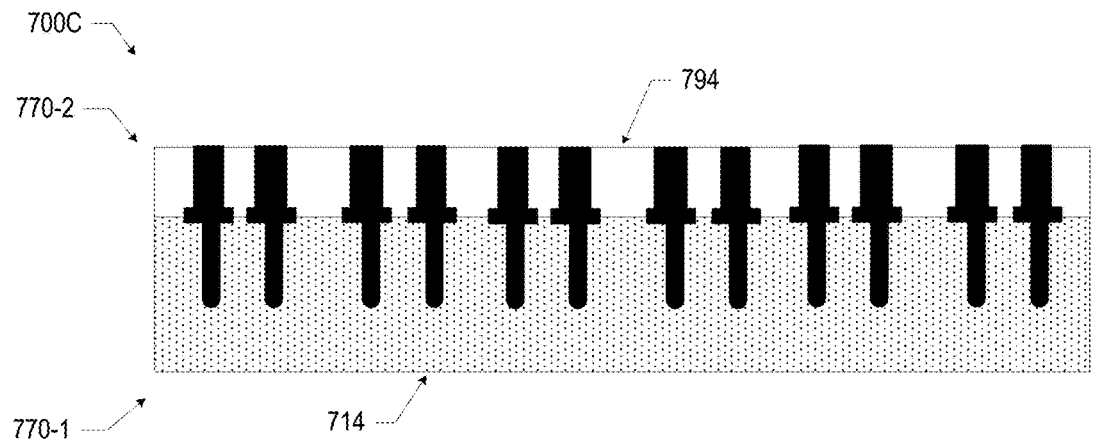

FIG. 7C illustrates an assembly 700C subsequent to providing a mold material 794 around the conductive pillars 792. The mold material 794 may be deposited using any suitable technique, such as described above with reference to FIG. 3. In some embodiments, the mold material is cured subsequent to deposition. In some embodiments, the mold material 794 may be initially deposited on and over the tops of the conductive pillars 792, then, polished back and planarized to expose the top surfaces of the conductive pillars 792. The technique used to deposit the mold material may depend on the type of mold material used. The mold material may be removed using any suitable technique, including, for example, grinding, etching, such as RIE or chemical etching. In some embodiments, the mold material used may depend on the desired characteristics for a microelectronic component 100. The mold material 794 may be any suitable mold material, as described above with reference to FIG. 1.

Figure 7D:
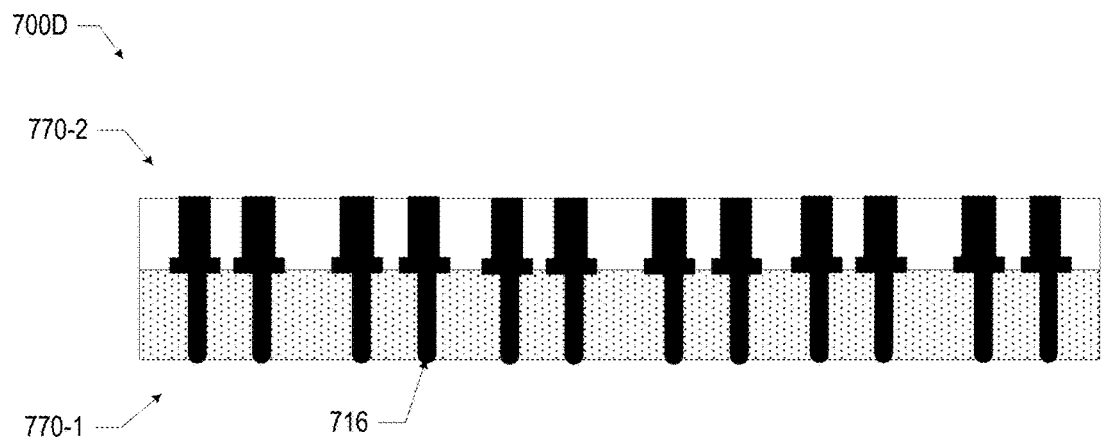

FIG. 7D illustrates an assembly 700D subsequent to removing non-electrical material from the bottom surface 770-1 of assembly 700C and planarizing to expose the bottom surface of the TSVs 716. The non-electrical material, which is an inactive portion of the wafer, may include silicon, ceramic, or quartz, among other materials. The non-electrical material may be removed using any suitable technique, including, for example, grinding, etching, such as RIE or chemical etching. In some embodiments, conductive contacts (not shown) may be formed at the bottom surface 770-1 of the TSVs 716, using any suitable technique. In some embodiments, when the substrate 714 at the bottom surface 770-1 is disposed on a carrier (not shown) during manufacturing operations, the carrier may be removed, and a second carrier (not shown) may be disposed on the top surface 770-2 of the assembly 700C. The second carrier may include any suitable material for providing mechanical stability during manufacturing operations and may be attached using any suitable technique, including a temporary adhesive layer or a DAF.

Figure 7E:
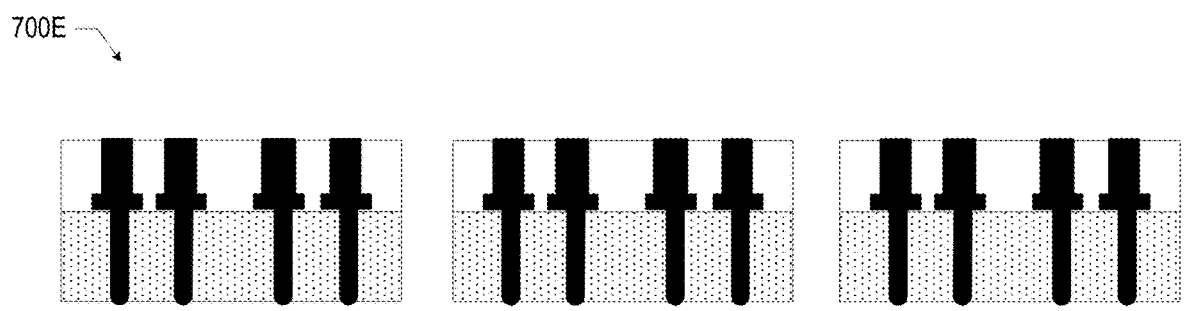

FIG. 7E illustrates an assembly 700E, also referred to herein as a microelectronic component, such as the microelectronic component 100 of FIG. 5, subsequent to singulating into individual units. In some embodiments, the individual units may be the same. In some embodiments, the individual units may differ.

The microelectronic assemblies 200 disclosed herein may be included in any suitable electronic component. FIGS. 8-11 illustrate various examples of apparatuses that may include, or be included in, any of the microelectronic assemblies 200 disclosed herein.

Figure 8:
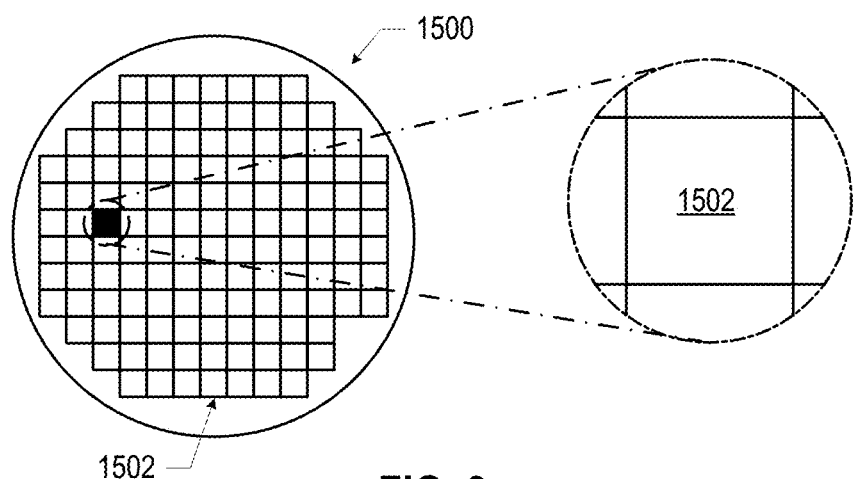
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic assemblies 200 disclosed herein (e.g., as any suitable ones of the dies 114). The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may be any of the dies 114 disclosed herein. The die 1502 may include one or more transistors (e.g., some of the transistors 1640 of FIG. 9, discussed below), supporting circuitry to route electrical signals to the transistors, passive components (e.g., signal traces, resistors, capacitors, or inductors), and/or any other IC components. In some embodiments, the wafer 1500 or the die 1502 may include a memory device (e.g., a random access memory (RAM) device, such as a static RAM (SRAM) device, a magnetic RAM (M RAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array. In some embodiments, a die 1502 (e.g., a die 114) may be a central processing unit, a radio frequency chip, a power converter, or a network processor. Various ones of the microelectronic assemblies 200 disclosed herein may be manufactured using a die-to-wafer assembly technique in which some dies 114 are attached to a wafer 1500 that include others of the dies 114, and the wafer 1500 is subsequently singulated.

Figure 9:
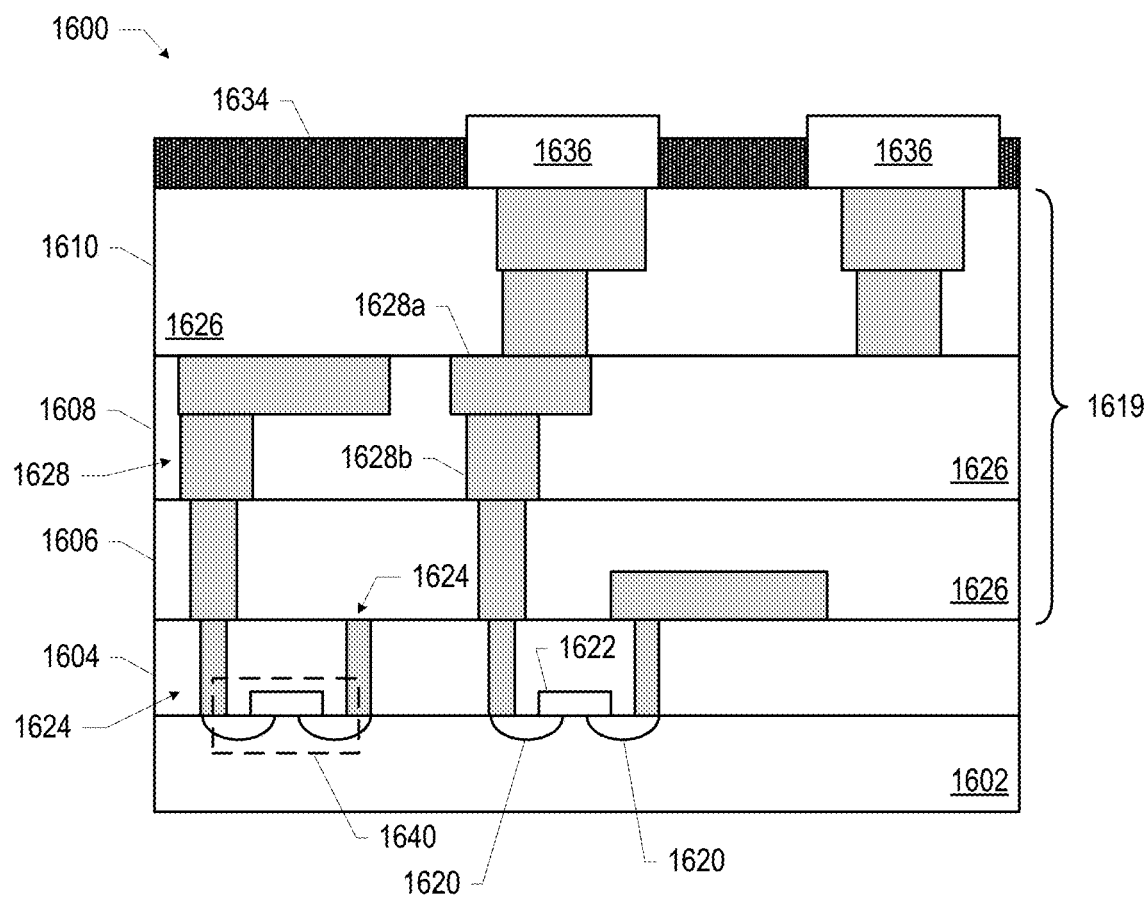
FIG. 9 is a cross-sectional side view of an IC device that may be included in a microelectronic assembly, in accordance with any of the embodiments disclosed herein.

FIG. 9 is a cross-sectional side view of an IC device 1600 that may be included in any of the microelectronic assemblies 200 disclosed herein (e.g., in any of the dies 114). One or more of the IC devices 1600 may be included in one or more dies 1502 (FIG. 8). The IC device 1600 may be formed on a die substrate 1602 (e.g., the wafer 1500 of FIG. 8) and may be included in a die (e.g., the die 1502 of FIG. 8). The die substrate 1602 may be a semiconductor substrate composed of semiconductor material systems including, for example, n-type or p-type materials systems (or a combination of both). The die substrate 1602 may include, for example, a crystalline substrate formed using a bulk silicon or a silicon-on-insulator (SOI) substructure. In some embodiments, the die substrate 1602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1602. Although a few examples of materials from which the die substrate 1602 may be formed are described here, any material that may serve as a foundation for an IC device 1600 may be used. The die substrate 1602 may be part of a singulated die (e.g., the dies 1502 of FIG. 8) or a wafer (e.g., the wafer 1500 of FIG. 8).

The IC device 1600 may include one or more device layers 1604 disposed on the die substrate 1602. The device layer 1604 may include features of one or more transistors 1640 (e.g., metal oxide semiconductor field-effect transistors (MOSFETs)) formed on the die substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a PMOS or a NMOS transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the die substrate 1602 and two sidewall portions that are substantially perpendicular to the top surface of the die substrate 1602. In other embodiments, at least one of the metal layers that form the gate electrode may simply be a planar layer that is substantially parallel to the top surface of the die substrate 1602 and does not include sidewall portions substantially perpendicular to the top surface of the die substrate 1602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the die substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the die substrate 1602 to form the S/D regions 1620. An annealing process that activates the dopants and causes them to diffuse farther into the die substrate 1602 may follow the ion-implantation process. In the latter process, the die substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 9. Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the die substrate 1602 upon which the device layer 1604 is formed. For example, the lines 1628a may route electrical signals in a direction in and out of the page from the perspective of FIG. 9. The vias 1628b may be arranged to route electrical signals in a direction of a plane that is substantially perpendicular to the surface of the die substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

In some embodiments in which the IC device 1600 is a double-sided die (e.g., like the die 114-1), the IC device 1600 may include another metallization stack (not shown) on the opposite side of the device layer(s) 1604. This metallization stack may include multiple interconnect layers as discussed above with reference to the interconnect layers 1606-1610, to provide conductive pathways (e.g., including conductive lines and vias) between the device layer(s) 1604 and additional conductive contacts (not shown) on the opposite side of the IC device 1600 from the conductive contacts 1636.

In other embodiments in which the IC device 1600 is a double-sided die (e.g., like the die 114-1), the IC device 1600 may include one or more TSVs through the die substrate 1602; these TSVs may make contact with the device layer(s) 1604, and may provide conductive pathways between the device layer(s) 1604 and additional conductive contacts (not shown) on the opposite side of the IC device 1600 from the conductive contacts 1636.

Figure 10:
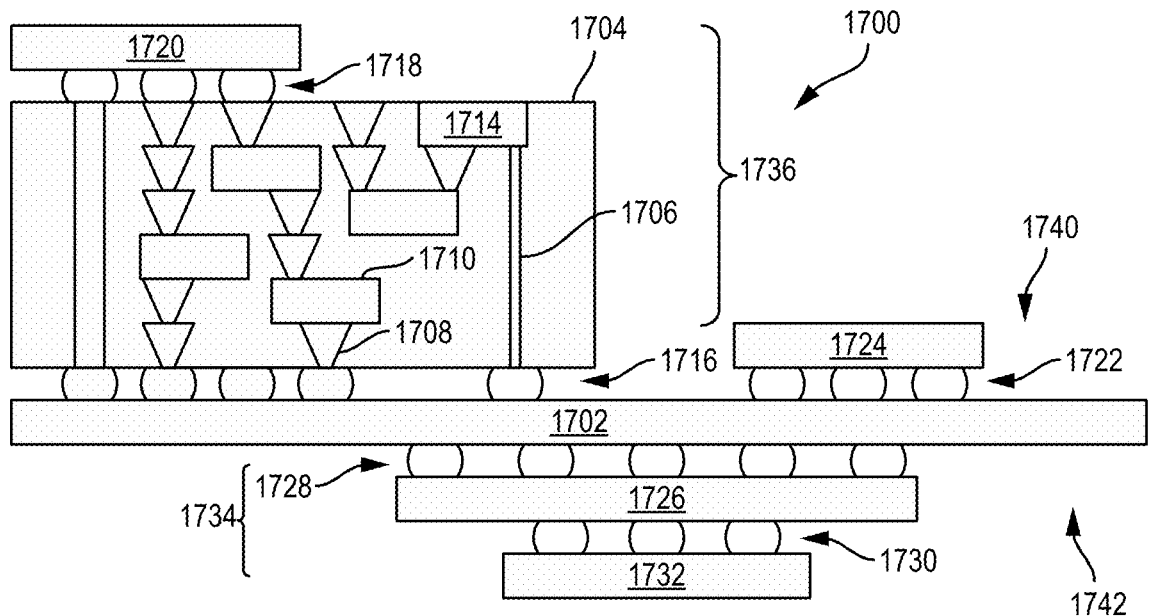
FIG. 10 is a cross-sectional side view of an IC device assembly that may include a microelectronic assembly, in accordance with any of the embodiments disclosed herein.

FIG. 10 is a cross-sectional side view of an IC device assembly 1700 that may include any of the microelectronic assemblies 200 disclosed herein. In some embodiments, the IC device assembly 1700 may be a microelectronic assembly 200. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any suitable ones of the embodiments of the microelectronic assemblies 200 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate. In some embodiments the circuit board 1702 may be, for example, a circuit board.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
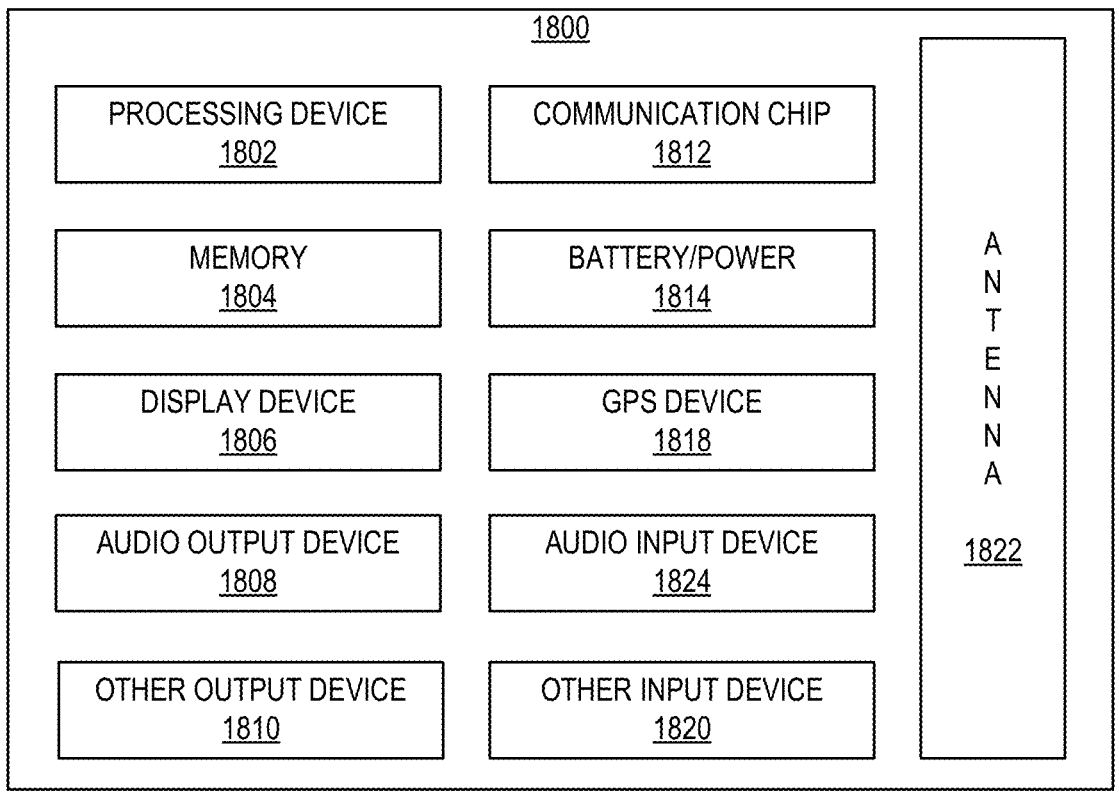
FIG. 11 is a block diagram of an example electrical device that may include a microelectronic assembly, in accordance with any of the embodiments disclosed herein.

FIG. 11 is a block diagram of an example electrical device 1800 that may include one or more of the microelectronic assemblies 200 disclosed herein. For example, any suitable ones of the components of the electrical device 1800 may include one or more of the IC device assemblies 1700, IC devices 1600, or dies 1502 disclosed herein, and may be arranged in any of the microelectronic assemblies 200 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), ASICs, CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMLS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a computing device or a hand-held, portable or mobile computing device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server, or other networked computing component, a printer, a scanner, a monitor, a set-top box, an entertainment control unit, a vehicle control unit, a digital camera, a digital video recorder, or a wearable computing device. In some embodiments, the electrical device 1800 may be any other electronic device that processes data.

The following paragraphs provide various examples of the embodiments disclosed herein.

Example 1 is a microelectronic component, including a substrate having a surface, wherein the substrate includes a conductive pathway; and a mold material region at the surface, wherein the mold material region includes a through-mold via (TMV) conductively coupled to the conductive pathway.

Example 2 may include the subject matter of Example 1, and may further specify that a thickness of the mold material region is between 5 microns and 50 microns.

Example 3 may include the subject matter of Examples 1 or 2, and may further specify that an overall thickness of the microelectronic component is between 30 microns and 150 microns.

Example 4 may include the subject matter of any of Examples 1-3, and may further specify that a mold material of the mold material region comprises one or more of: an organic polymer, an organic dielectric material, a fire retardant grade 4 material, a bismaleimide triazine resin, a polyimide material, a glass reinforced epoxy matrix material, a low-k dielectric, and an ultra-low-k dielectric.

Example 5 may include the subject matter of any of Examples 1-4, and may further specify that the conductive pathway is a through-substrate via.

Example 6 may include the subject matter of any of Examples 1-5, and may further specify that the substrate is a wafer.

Example 7 may include the subject matter of Example 6, and may further specify that the wafer is an active wafer.

Example 8 may include the subject matter of Example 6, and may further specify that the wafer is a passive wafer.

Example 9 may include the subject matter of Example 6, and may further specify that the wafer further includes a plurality of through-substrate vias.

Example 10 is a microelectronic assembly, including: a package substrate having a first surface and an opposing second surface; a microelectronic component embedded in the package substrate, the microelectronic component including: a substrate having a surface, wherein the substrate includes conductive pathways; and a mold material region at the surface, wherein the mold material region includes a plurality of through-mold vias (TMVs) electrically coupled to the conductive pathways, and wherein the mold material region is at the second surface of the package substrate; and a die electrically coupled, at the second surface of the package substrate, to one or more of the plurality of TMVs of the microelectronic component by first interconnects and to the package substrate by second interconnects.

Example 11 may include the subject matter of Example 10, and may further specify that the first interconnects have a first pitch and the second interconnects have a second pitch different from the first pitch.

Example 12 may include the subject matter of Example 11, and may further specify that the first pitch is between 15 microns and 70 microns.

Example 13 may include the subject matter of Example 11, and may further specify that the second pitch is between 50 microns and 500 microns.

Example 14 may include the subject matter of Example 10, and may further specify that the die is a first die, and may further include a second die electrically coupled, at the second surface of the package substrate, to one or more of the plurality of TMVs of the microelectronic component by the first interconnects and to the package substrate by the second interconnects.

Example 15 may include the subject matter of any of Examples 10-14, and may further include: an underfill material at the second surface of the package substrate between the die and the package substrate.

Example 16 is a computing device, including: a microelectronic assembly, including: a package substrate having a first surface and an opposing second surface; a microelectronic component embedded in the package substrate, the microelectronic component including: a substrate having a surface, wherein the substrate includes conductive pathways; and a mold material region at the surface, wherein the mold material region includes a plurality of through-mold vias (TMVs) electrically coupled to the conductive pathways, and wherein the mold material region is at the second surface of the package substrate; and a die electrically coupled, at the second surface of the package substrate, to one or more of the plurality of TMVs of the microelectronic component via first interconnects and to the package substrate via second interconnects; and a circuit board electrically coupled to the first surface of the package substrate.

Example 17 may include the subject matter of Example 16, and may further specify that the first interconnects have a first pitch and the second interconnects have a second pitch different from the first pitch.

Example 18 may include the subject matter of Example 17, and may further specify that the first pitch is between 15 microns and 70 microns and the second pitch is between 50 microns and 500 microns.

Example 19 may include the subject matter of any of Examples 16-18, and may further specify that the die is a central processing unit, a radio frequency chip, a power converter, or a network processor.

Example 20 may include the subject matter of any of Examples 16-19, and may further specify that the computing device is a server.

Example 21 is a method of manufacturing a microelectronic component, including: forming a through-mold via (TMV) on a surface of a substrate having a conductive pathways, wherein the TMV is conductively coupled to one or more of the conductive pathways on the substrate; and forming an insulating material around the TMV.

Example 22 may include the subject matter of Example 21, and may further include: planarizing the insulating material.

Example 23 may include the subject matter of Examples 21 or 22, and may further specify that the substrate has a first surface and an opposing second surface, and wherein the surface of the substrate is the second surface, and may further include: attaching an adhesive layer to the first surface of the substrate.

Example 24 may include the subject matter of any of Examples 21-23, and may further specify that the insulating material is a mold material.

Example 25 may include the subject matter of any of Examples 21-24, and may further specify that the substrate is a wafer.

The invention claimed is:

1. A microelectronic component, comprising:
a substrate having a surface, wherein the substrate includes a conductive pathway; and
a mold material region at the surface, wherein the mold material region includes a through-mold via (TMV)

conductively coupled to the conductive pathway, and wherein an overall thickness of the microelectronic component is between 30 microns and 150 microns.

2. The microelectronic component of claim 1, wherein a thickness of the mold material region is between 5 microns and 50 microns.

3. The microelectronic component of claim 1, wherein a mold material of the mold material region comprises one or more of: an organic polymer, an organic dielectric material, a fire retardant grade 4 material, a bismaleimide triazine resin, a polyimide material, a glass reinforced epoxy matrix material, a low-k dielectric, and an ultra-low-k dielectric.

4. The microelectronic component of claim 1, wherein the conductive pathway is a through-substrate via.

5. The microelectronic component of claim 1, wherein the substrate is a wafer.

6. The microelectronic component of claim 5, wherein the wafer is an active wafer.

7. The microelectronic component of claim 5, wherein the wafer is a passive wafer.

8. The microelectronic component of claim 5, wherein the wafer further includes a plurality of through-substrate vias.

9. A microelectronic assembly, comprising:
a package substrate having a first surface and an opposing second surface;
a microelectronic component embedded in the package substrate, the microelectronic component including:
a substrate having a surface, wherein the substrate includes conductive pathways; and
a mold material region at the surface, wherein the mold material region includes a plurality of through-mold vias (TMVs) electrically coupled to the conductive pathways, and wherein the mold material region is at the second surface of the package substrate; and
a die electrically coupled, at the second surface of the package substrate, to one or more of the plurality of TMVs of the microelectronic component by first interconnects having a pitch between 15 microns and 70 microns and to the package substrate by second interconnects.

10. The microelectronic assembly of claim 9, wherein the pitch of the first interconnects is a first pitch and the second interconnects have a second pitch between 50 microns and 500 microns.

11. The microelectronic assembly of claim 9, wherein the die is a first die, and further comprising:
a second die electrically coupled, at the second surface of the package substrate, to one or more of the plurality of TMVs of the microelectronic component by the first interconnects and to the package substrate by the second interconnects.

12. The microelectronic assembly of claim 9, further comprising:
an underfill material at the second surface of the package substrate between the die and the package substrate.

13. A computing device, comprising:
a microelectronic assembly, including:
a package substrate having a first surface and an opposing second surface;
a microelectronic component embedded in the package substrate, the microelectronic component including:
a substrate having a surface, wherein the substrate includes conductive pathways; and
a mold material region at the surface, wherein the mold material region includes a plurality of through-mold vias (TMVs) electrically coupled to the conductive pathways, and wherein the mold material region is at the second surface of the package substrate; and
a die electrically coupled, at the second surface of the package substrate, to one or more of the plurality of TMVs of the microelectronic component via first interconnects having a first pitch between 15 microns and 70 microns and to the package substrate via second interconnects having a second pitch between 50 microns and 500 microns; and
a circuit board electrically coupled to the first surface of the package substrate.

14. The computing device of claim 13, wherein the die is a central processing unit, a radio frequency chip, a power converter, or a network processor.

15. The computing device of claim 13, wherein the computing device is a server.

* * * * *